(12) United States Patent
Thorp et al.

(10) Patent No.: US 8,379,437 B2
(45) Date of Patent: Feb. 19, 2013

(54) FLEXIBLE MULTI-PULSE SET OPERATION FOR PHASE-CHANGE MEMORIES

(75) Inventors: Tyler Thorp, Palo Alto, CA (US); Roy E. Scheuerlein, Cupertino, CA (US)

(73) Assignee: SanDisk 3D, LLC, Milpitas, CA (US)

( * ) Notice: Subject to any disclaimer, the term of this patent is extended or adjusted under 35 U.S.C. 154(b) by 272 days.

(21) Appl. No.: 12/551,553

(22) Filed: Aug. 31, 2009

(65) Prior Publication Data
US 2011/0051506 A1 Mar. 3, 2011

(51) Int. Cl.
*G11C 11/00* (2006.01)
*G11C 7/00* (2006.01)
(52) U.S. Cl. .................. 365/163; 365/189.011; 365/148
(58) Field of Classification Search .................. 365/163, 365/189.011, 148
See application file for complete search history.

(56) References Cited

U.S. PATENT DOCUMENTS

| | | | |
|---|---|---|---|
| 5,737,259 A | 4/1998 | Chang | |
| 5,982,659 A | 11/1999 | Irrinki et al. | |
| 6,191,972 B1 | 2/2001 | Miura et al. | |
| 6,545,898 B1 | 4/2003 | Scheuerlein | |
| 6,618,295 B2 | 9/2003 | Scheuerlein | |
| 6,625,054 B2 | 9/2003 | Lowrey et al. | |
| 6,747,893 B2 * | 6/2004 | Uribe et al. ............... | 365/185.03 |
| 6,822,903 B2 | 11/2004 | Scheuerlein et al. | |
| 6,963,504 B2 | 11/2005 | Scheuerlein et al. | |
| 7,283,387 B2 | 10/2007 | Cho et al. | |
| 7,577,024 B2 | 8/2009 | Fackenthal et al. | |
| 7,813,167 B2 | 10/2010 | Porter | |
| 7,869,260 B2 | 1/2011 | Ueda | |
| 8,014,201 B2 * | 9/2011 | Park ........................ | 365/185.11 |
| 2006/0166455 A1 * | 7/2006 | Gordon et al. ............ | 438/385 |
| 2009/0052227 A1 | 2/2009 | Edahiro | |
| 2009/0207647 A1 | 8/2009 | Maejima | |

FOREIGN PATENT DOCUMENTS

WO WO 2008-013619 1/2008

OTHER PUBLICATIONS

Thorp et al., U.S. Appl. No. 12/551,548, filed Aug. 31, 2009.
Thorp et al., U.S. Appl. No. 12/551,546, filed Aug. 31, 2009.
Partial International Search of related International Application No. PCT/US2010/045684 Annex to invitation to pay additional fees dated Nov. 18, 2010.
Office Action of U.S. Appl. No. 12/551,548 mailed Jan. 6, 2011.
International Search Report and Written Opinion of related International Application No. PCT/US2010/045684 Jan. 31, 2011.
Apr. 5, 2011 Reply to Jan. 6, 2011 Office Action of related U.S. Appl. No. 12/551,548.
Notice of Allowance of U.S. Appl. No. 12/551,546 mailed Apr. 15, 2011.
Notice of Allowance of related U.S. Appl. No. 12/551,548 mailed May 23, 2011.
Lee et al., "A 90nm 1.8V 512Mb Diode-Switch Pram with 266MB/s Read Throughput", Feb. 14, 2007; 2007 IEEE International Solid-State Circuits Conference, Session 26/Non-Volatile Memories/26.1, pp. 472, 473 and 616.

(Continued)

*Primary Examiner* — VanThu Nguyen
*Assistant Examiner* — Hai Pham
(74) *Attorney, Agent, or Firm* — Dugan & Dugan, PC

(57) ABSTRACT

Methods and apparatus are provided that include reading a plurality of sets of program pulse tuning instructions from a memory page, the memory page including a plurality of memory cells; and creating a plurality of program pulses in accordance with the plurality of sets of program pulses to program the plurality of memory cells. The plurality of sets of program pulse tuning instructions may be different from one another in at least one respect.

7 Claims, 4 Drawing Sheets

OTHER PUBLICATIONS

Hanzawa et al., "A 512kB Embedded Phase Change Memory with 416kB/s Write Throughput at 100μA Cell Write Current", 2007 IEEE International Solid-State Circuits Conference, Session 26/Non-Volatile Memories/26.2, pp. 474, 475 and 616.

Notice of Allowance of U.S. Appl. No. 12/551,546 mailed Jun. 21, 2011.

Notice of Allowance of related U.S. Appl. No. 12/551,548 mailed Oct. 26, 2011.

Thorp et al., U.S. Appl. No. 13/403,454, filed Feb. 23, 2012.

Office Action of related U.S. Appl. No. 13/403,454 mailed Sep. 21, 2012.

Dec. 19, 2012 Terminal Disclaimers and Response to Sep. 21, 2012 Office Action of related U.S. Appl. No. 13/403,454.

\* cited by examiner

FLEXIBLE MULTI-PULSE SET OPERATION FOR PHASE-CHANGE MEMORIES

CROSS REFERENCE TO RELATED APPLICATIONS

The present application is related to the following patent applications, which are hereby incorporated by reference herein in their entirety for all purposes:

U.S. patent application Ser. No. 12/551,546, filed Aug. 31, 2009, and entitled "CREATING SHORT PROGRAM PULSES IN ASYMMETRIC MEMORY ARRAYS"; and U.S. patent application Ser. No. 12/551,548, filed Aug. 31, 2009, and entitled "REDUCING PROGRAMMING TIME OF A MEMORY CELL".

FIELD OF THE INVENTION

The present invention relates generally to integrated circuits including memory arrays, and more particularly, to flexible multi-pulse set operations for phase-change memories.

BACKGROUND OF THE INVENTION

Multi-pulse set operations (e.g., "pulse trains") may be used in programming memories. Such multi-pulse set operations may include multiple program/read/verify operations, and therefore may not be practical for phase-change memories. Thus, what are needed are methods and apparatus including multi-pulse set operations for phase-change memories.

SUMMARY OF THE INVENTION

In a first aspect of the invention, a method of programming a plurality of two terminal memory cells may be provided. The method may include reading a plurality of sets of program pulse tuning instructions from a memory page, the memory page including the plurality of memory cells; and creating a plurality of program pulses in accordance with the plurality of sets of program pulses to program the plurality of memory cells. The plurality of sets of program pulse tuning instructions may be different from one another in at least one respect.

In a second aspect of the invention, a method of programming two terminal memory cells may be provided. The method may include reading information of a memory page including first, second, and nth memory cells, the information including first, second, and nth program pulse tuning instructions; creating a first program pulse in accordance with the first program pulse tuning instructions so as to program the first memory cell; locking the first memory cell from further programming pulses; creating a second program pulse in accordance with the second program pulse tuning instructions so as to program the second memory cell; locking the second memory cell from further programming pulses; and creating an nth program pulse in accordance with the nth program pulse tuning instructions so as to program the nth memory cell.

In a third aspect of the invention, a method of programming a plurality of two terminal memory cells may be provided. The method may include providing a memory page including a sideband area, the sideband area including first, second, and nth program pulse tuning instructions; providing first, second, and nth memory cells, the first, second, and nth memory cells being a part of the memory page; providing a first line connected to the first, second, and nth memory cells; providing a first line driver connected to the first line; providing a first line select configured to control the first line driver; providing a control circuit selectively connected to the first line through the first line driver when the first line select is enabled, the control circuit configured to set the first line to a first voltage from a first line standby voltage; providing a second line connected to the first, second, and nth memory cells; providing a second line driver connected to the second line; providing a second line select configured to control the second line driver; and providing a sense amplifier selectively connected to the second line through the second line driver when the second line select is enabled, the sense amplifier configured to charge the second line to a predetermined voltage from a second line standby voltage. In accordance with the first, second, and nth program pulse tuning instructions, first, second, and nth times, the first line may be set to a first voltage, the second line may be charged to a predetermined voltage, the first line may be switched from the first voltage to a second voltage, and the first line may be switched from the second voltage to a third voltage, to create first, second, and nth programming pulses. The first and third voltages when coupled with the predetermined voltage may result in safe voltages not to program the first, second, and nth memory cells, the second voltage when coupled with the predetermined voltage may result in a programming voltage to program the first, second, and nth memory cells.

In a fourth aspect of the invention, a memory array including a plurality of two terminal memory cells may be provided. The memory array may include first, second, and nth memory cells; a memory page including the first, second, and nth memory cells; and information including first, second, and nth program pulse tuning instructions.

In a fifth aspect of the invention, a memory array including a plurality of two terminal memory cells may be provided. The memory array may include first, second, and nth memory cells; a memory page including the first, second, and nth memory cells; and a memory page sideband area including first, second, and nth program pulse tuning instructions. The memory array may be configured to read the first, second, and nth program pulse tuning instructions; create a first program pulse in accordance with the first program pulse tuning instructions so as to program the first memory cell; lock the first memory cell from further programming pulses; create a second program pulse in accordance with the second program pulse tuning instructions so as to program the second memory cell; lock the second memory cell from further programming pulses; and create an nth program pulse in accordance with the nth program pulse tuning instructions so as to program the nth memory cell.

In a sixth aspect of the invention, a memory array including a plurality of two terminal memory cells may be provided. The memory array may include a memory page including a sideband area, the sideband area including first, second, and nth program pulse tuning instructions; first, second, and nth memory cells, the first, second, and nth memory cells being a part of the memory page; a first line connected to the first, second, and nth memory cells; a first line driver connected to the first line; a first line select configured to control the first line driver; a control circuit selectively connected to the first line through the first line driver when the first line select is enabled, the control circuit configured to set the first line to a first voltage; a second line connected to the first, second, and nth memory cells; a second line driver connected to the second line; a second line select configured to control the second line driver; and a sense amplifier selectively connected to the second line through the second line driver when the second line select is enabled, the sense amplifier configured to charge the second line to a predetermined voltage. In accordance with the first, second, and nth program pulse tuning instructions, first, second, and nth times, the first line may be set to a first voltage, the second line may be charged to a predetermined voltage, the first line may be switched from the first voltage to a second voltage, and the first line may be switched from the second voltage to a third voltage, to create first, second, and nth programming pulses. The first and third voltages when coupled with the predetermined voltage may result in safe voltages not to program the first, second, and nth memory cells, the second voltage when coupled with the predetermined voltage may result in a programming voltage to program the first, second, and nth memory cells.

Other features and aspects of the present invention will become more fully apparent from the following detailed description, the appended claims and the accompanying drawings.

DETAILED DESCRIPTION

Figure 1:
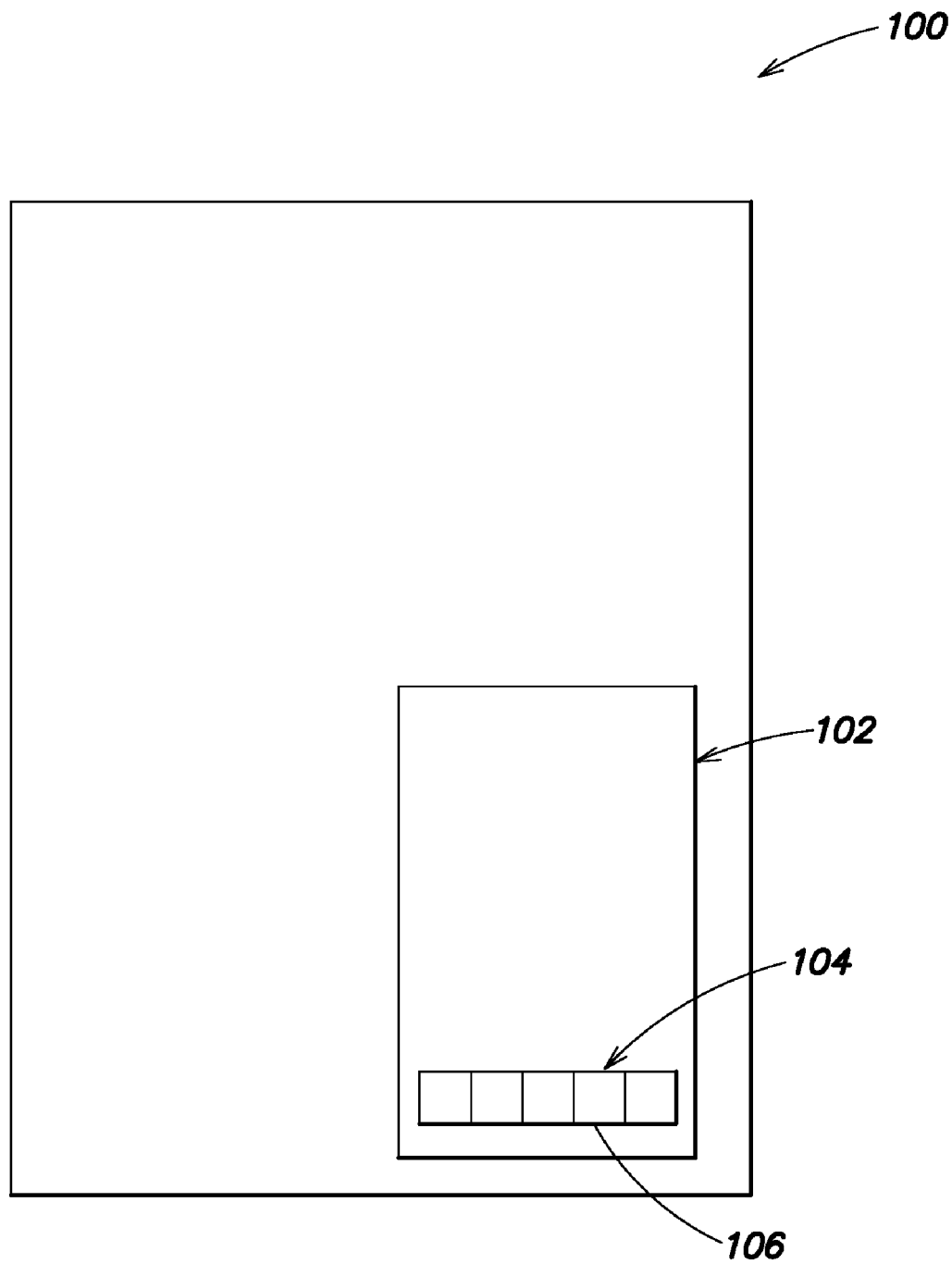
FIG. 1 is a schematic representation of an electronic device according to an embodiment of the present invention.

Reference will now be made in detail to embodiments of the present invention, examples of which are illustrated in the accompanying drawings, wherein like reference numerals refer to the like elements throughout. The embodiments are described below to explain the present invention by referring to the figures.

As used herein, the terms "a", "an" and "the" may refer to one or more than one of an item. The terms "and" and "or" may be used in the conjunctive or disjunctive and will generally be understood to be equivalent to "and/or". For brevity and clarity, a particular quantity of an item may be described or shown while the actual quantity of the item may differ.

Initially, it should be noted that the term voltage should be broadly interpreted to include the phrase "programming energy".

In accordance with an embodiment of the present invention, program pulses may be created in accordance with program pulse tuning information. The program pulse tuning information may include, for example, a voltage level instruction, a voltage duration instruction, a voltage rising time constant, and a voltage falling time constant instruction. The program pulse tuning information may be for multiple program pulses and may be different for each program pulse. Accordingly, flexible multi-pulse set operations for phase-change memories may be created.

These flexible multi-pulse set operations may be customized for a variety of programming conditions. For example and not by way of limitation, flexible multi-pulse set operations may be customized based on where in a memory array the cells to be programmed are located (e.g., near versus far relative to a bit line driver or word line driver), how many cells are to be programmed, and programming temperature.

In creating these flexible multi-pulse set operations, a switch from a safe voltage to a programming voltage may be made. By switching from the safe voltage to the programming voltage (e.g., instead of switching from a standby voltage to the programming voltage), a much smaller voltage change may be used during programming that does not require the current to be limited.

FIG. 1 is a schematic representation of an electronic device 100 according to an embodiment of the present invention. The electronic device 100 may include an integrated circuit 102. The integrated circuit 102 may include a memory array 104. The memory array 104 may include a memory cell 106. The memory cell 106 is shown as part of the memory array 104 which is shown as part of the integrated circuit 102 which is shown as part of the electronic device 100. However, the electronic device 100 may otherwise access memory cells 106.

The electronic device 100 may include any of a variety of known or later-developed electronic devices that include or access memory cells 106. For example and not by way of limitation, the electronic device 100 may include a flash drive, a digital audio player, and/or a portable computer.

Figure 2A:
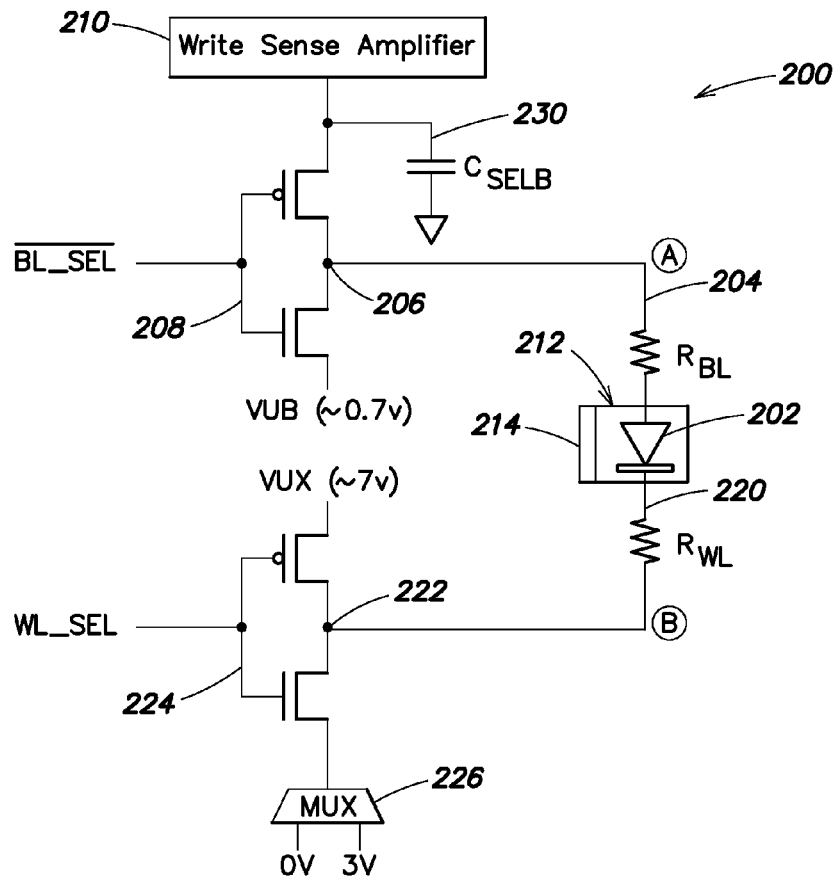
FIG. 2A is a schematic representation of a memory array, such as the memory array of FIG. 1.

FIG. 2A is a schematic representation of a memory array 200, such as the memory array 104 of FIG. 1. The memory array 200 may include a memory cell 202, a bit line 204, a bit line driver 206, a bit line select 208, a sense amplifier 210, a line driver 220, a word line driver 222, a word line select 224, a control circuit 226, and a capacitor 230.

The memory cell 202 may be a part of a memory page 212. A memory page address may identify a location within the memory array 200. The memory cell 202 may be within the location identified by the memory page address, along with other memory cells.

The memory cell 202 may be formed of any of a variety of known or later-developed materials. For example and not by way of limitation, the memory cell 202 may be formed of chalcogenide/PVM or chalcogenide-type materials. The memory cell 202 may be a two-terminal memory cell. The memory cell 202 may include an isolation unit. The isolation unit may include a diode including an anode and a cathode. The anode side may be sensed. The cathode side may be controlled. Alternatively, the anode side may be controlled, and the cathode side may be sensed.

The memory cell 202 may be connected to the bit line 204. The bit line 204 may be on the anode side of the memory cell 202. That is, the bit line may be on the sensed side. The bit line 204 may be long relative to the word line 220. The bit line 204 may be connected to the bit line driver 206. The bit line driver 206 may be controlled by the bit line select 208. When the bit line select 208 is enabled, it may connect the bit line 204 to the sense amplifier 210. The bit line driver 206 may be enabled or disabled based on a charge of the capacitor 230.

The memory cell 202 may be connected to the word line 220. The word line 220 may be on the cathode side of the memory cell 202. That is, the word line may be on the side that is controlled. The word line 220 may be connected to the word line driver 222. The word line driver 222 may be controlled by the word line select 224. When the word line select 224 is enabled, it may connect the word line 220 to the control circuit 226. The word line 220 may be shorted together with another word line so that word lines are shared.

The sense amplifier 210 may be a write sense amplifier. As will be described further below, the sense amplifier 210 may control programming of the memory cell 202 in conjunction with the control circuit 226.

The control circuit 226 may include a dedicated regulator (e.g., a MUX). The control circuit 226 may control the amount of voltage applied to the word line 220. The control circuit 226 may switch between two voltages.

It should be noted that the word line and bit line may be switched between more than two voltages, such as from standby voltages to, for example, a first voltage and to a second voltage. Examples of standby voltages are described in U.S. Pat. Nos. 6,822,903 and 6,963,504, both to Scheuerlein and Knall, and both entitled "APPARATUS AND METHOD FOR DISTURB-FREE PROGRAMMING OF PASSIVE ELEMENT MEMORY CELLS", both of which are incorporated by reference herein in their entirety for all purposes. In these examples, first and second array lines may be driven to selected bias voltages. Then, the first and second array lines may be driven to unselected bias voltages. The timing of when the first and second array lines may be driven to selected bias voltages and when the first and second array lines may be driven to unselected bias voltages may be adjusted relative to one another (i.e., the first array line relative to the second array line), for example, to prevent unintended programming of cells located near target cells in an array. It should be appreciated that in the present disclosure, such standby voltages should not be confused with the first voltage (i.e., as discussed below, the voltage that, when coupled with the voltage applied to the bit line, results in a safe voltage).

The first voltage (e.g., 3 volts) may be high enough that relative to the voltage applied to the bit line 204 (e.g., 8 volts), the resulting net voltage (e.g., 5 volts) is less than a voltage needed to program the memory cell 202. That is, the first voltage may result in a safe voltage. The second voltage (e.g., 0 volts) may be low enough that relative to the voltage applied to the bit line 204 (e.g., 8 volts), the resulting net voltage (e.g., 8 volts) is effective to program the memory cell 202. That is, the second voltage may result in a programming voltage.

Alternatively, the control circuit 226 may include a diode connected NMOS device and a bypass path. The diode connected NMOS device may generate the first voltage (i.e., the safe voltage). The bypass path, when selected, may generate the second voltage (result in the programming voltage).

The actual value of the first and second voltages may be determined based upon multiple considerations. One consideration may be that the difference between the two voltages should be sufficient to distinguish between programming and not programming. Another consideration may be that the smaller the difference between the two voltages is, the faster the programming of the memory cell 202 may be.

Figure 2B:
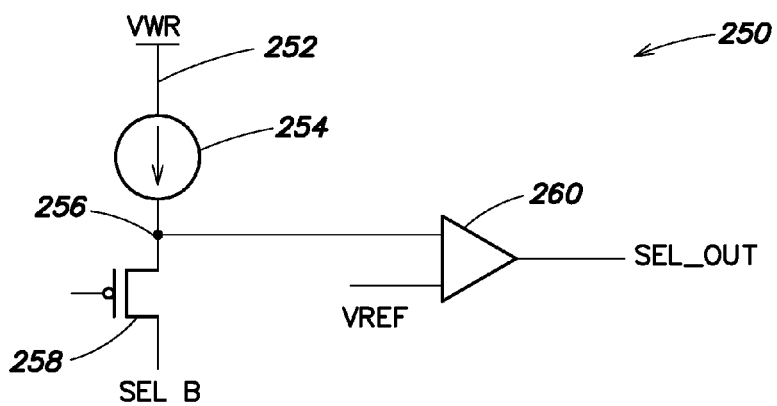
FIG. 2B is a schematic representation of a sense amplifier, such as the sense amplifier of FIG. 2A.

FIG. 2B is a schematic representation of a sense amplifier 250, such as the sense amplifier 210 of FIG. 2A. The sense amplifier 250 may be a write sense amplifier. The sense amplifier 250 may control programming of the memory cell 202 in conjunction with the control circuit 226. The sense amplifier 250 may include a voltage 252, a current limiter 254, a node 256, a pMOS 258, and a voltage reference 260.

The voltage 252 may flow through the current limiter 254, the node 256, and the pMOS 258. The current limit may limit to a predetermined amount (e.g., 1 microamp). The voltage 252 may be compared with the voltage reference 260. Once the memory cell 202 programs, the voltage 252 flowing through the node 256 may fall.

The memory page 212 may include a sideband area 214. The sideband area 214 may store, for example, overhead information associated with the memory page 212. The sideband area 212 may store program pulse tuning information. One of ordinary skill in the art will appreciate that program pulse tuning information could be stored, for example, per set of pages or per chip. Accordingly, the term memory page should be interpreted broadly.

The program pulse tuning information may affect program pulse parameters. The program pulse tuning information may include a voltage level instruction, a voltage duration instruction, a voltage rising time constant instruction, and a voltage falling time constant instruction. The voltage level instruction may include a steady voltage, or a varying voltage (e.g., a linear decrease 433 as shown in the third pulse 430 of FIG. 4A).

Figure 3:
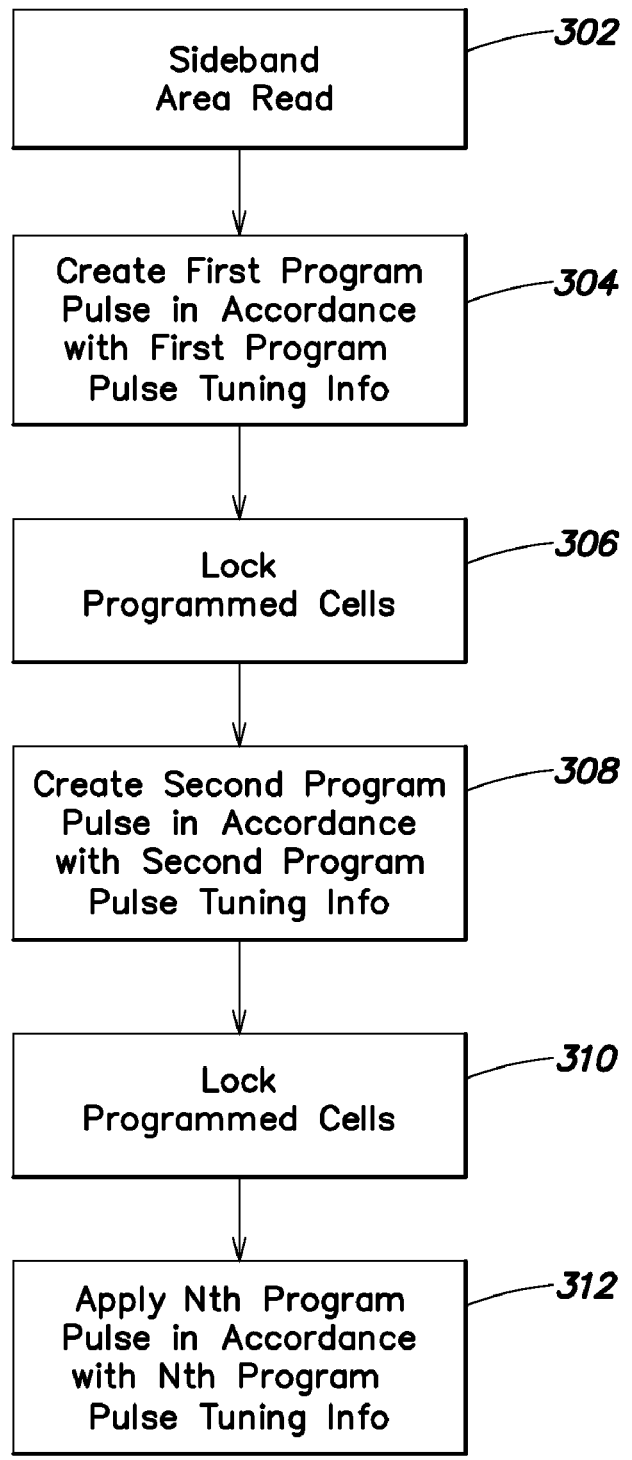
FIG. 3 is a schematic representation of an exemplary method of generating a flexible multi-pulse set operation.

The operation of the memory array 200 is now described with reference to FIGS. 3-4B, which illustrate, inter alia, an exemplary method of generating a flexible multi-pulse set operation.

In operation 302, a sideband area 214 of a memory page 212 may be read. As noted above, the sideband area 214 may include program pulse tuning information. The program pulse tuning information may include, in this example, a voltage level instruction, a voltage duration instruction, and a voltage falling time constant instruction. The program pulse tuning information may be for multiple program pluses and may be different for each program pulse (i.e., in operation 302, first, second, and nth program pulse tuning information may be read).

In operation 304, a first program pulse 410 (FIG. 4A) may be created in accordance with the first program pulse tuning information. The first voltage level, voltage duration, and voltage falling time constant instructions may cause the word line 220 and bit line 204 to create the first program pulse 410.

For example and not by way of limitation, the first voltage level instruction may be for a first voltage 412 of 7 volts steady. The first voltage duration instruction may be for a first duration. The first voltage falling time constant instruction may be for a first voltage falling time constant 414. The word line 220 may be set to voltage 450 (FIG. 4B). The bit line 204 may be charged from an initial level to a predetermined voltage (e.g., 8 volts). Voltage 450 of the word line (e.g. 3 volts) may be high enough that relative to the predetermined voltage of the bit line 204 (e.g., 8 volts), a net voltage (e.g., 5 volts) results that is less than a voltage needed to program the memory cell 202.

Figure 4A:
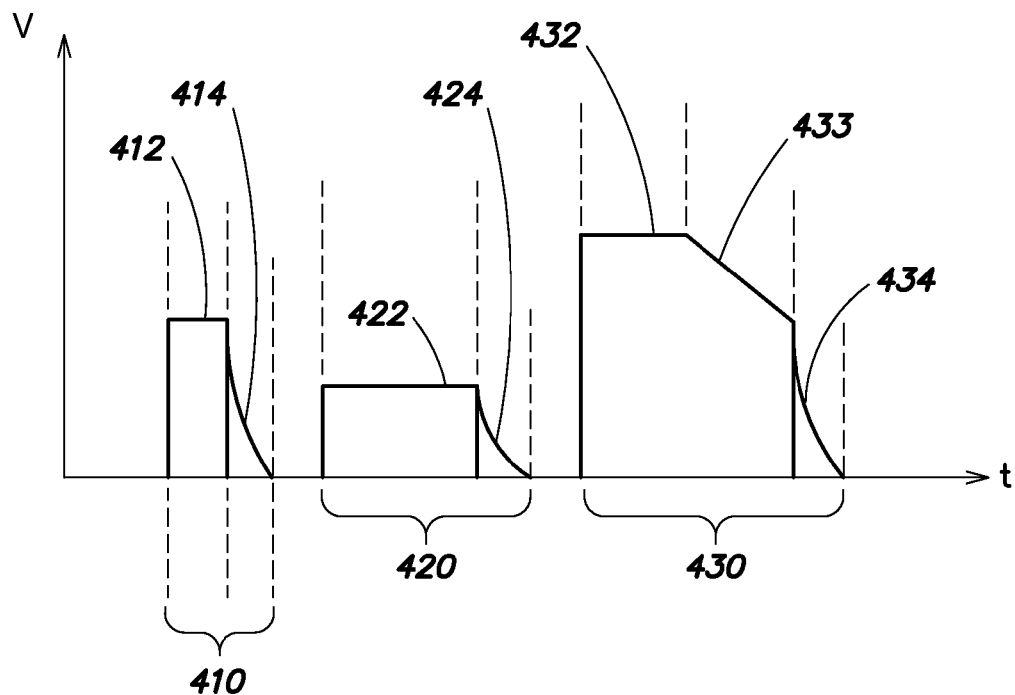
FIG. 4A is a schematic representation of voltages in accordance with an embodiment of the present invention.
Figure 4B:
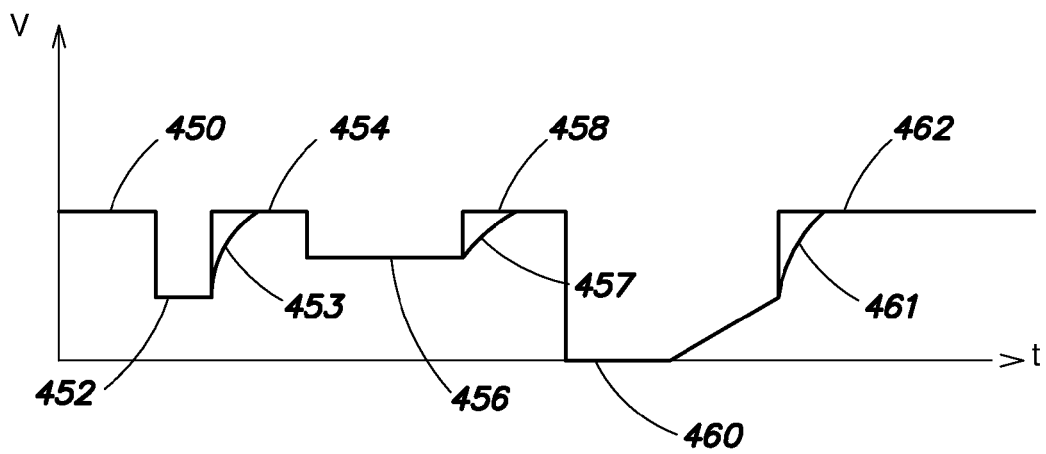
FIG. 4B is a schematic representation of voltages in accordance with an embodiment of the present invention.

Referring to FIGS. 4A and 4B, the word line 220 may be switched from voltage 450 to voltage 452. Note that in FIGS. 4A and 4B, the vertical axis represent voltage and the horizontal axis represent time. Voltage 452 (e.g., 1 volt) may be low enough that relative to the predetermined voltage applied to the bit line 204 (e.g., 8 volts), a net voltage (e.g., 7 volts) results that is effective to program memory cells. The word line 220 may be switched from voltage 452 to voltage 454. This switching from voltage 450 to voltage 452 to voltage 454 therefore together may create first program pulse 410.

Voltage 452 may be steady for the duration called for by the first voltage duration instruction such that the first voltage 412 results at a steady level. Voltage 452 may be switched to voltage 454 including falling time constant 453 according to the first falling time constant instruction such that first falling time constant 414 results.

In operation 306, memory cells programmed by the first program pulse 410 may be locked so as to not receive any further programming pulses. For example and not by way of limitation, seventy percent (70%) of memory cells in the memory page 212 may be successfully programmed by the first program pulse 410. Accordingly, these memory cells (i.e., the seventy percent (70%) that were programmed) may be locked so as to not receive any further programming pulses.

In some embodiments, the memory cells that are successfully programmed are determined to be successfully programmed during programming. Exemplary methods may include NAND lockout schemes. The determination may be made based on a switch from a first voltage of a sense amplifier 210 to a second voltage for each memory cell. In other embodiments, the memory cells that are successfully programmed are determined after programming by verifying whether each memory cell has been programmed.

In operation 308, a second program pulse 420 may be created in accordance with the second program pulse tuning information. The second voltage level, voltage duration, and voltage falling time constant instructions may cause the word line 220 and bit line 204 to create the second program pulse 420.

For example and not by way of limitation, the second voltage level instruction may be for a second voltage 422 of 6 volts steady. The second voltage duration instruction may be for a second duration. The second voltage falling time constant instruction may be for a second voltage falling time constant 424. The word line 220 may be set to or remain at voltage 454 (e.g., 3 volts). The bit line 204 may be charged to or remain at a predetermined voltage (e.g., 8 volts). Voltage 454 of the word line (e.g., 3 volts) may be high enough relative to the predetermined voltage of the bit line 204 (e.g., 8 volts) that a net voltage (e.g., 5 volts) results that may be less than a voltage needed to program a memory cell.

The word line 220 may be switched from voltage 454 to voltage 456. Voltage 456 (e.g., 2 volts) may be low enough that relative to the predetermined voltage applied to the bit line 204 (e.g., 8 volts), a net voltage (e.g., 6 volts) results that is effective to program memory cells. The word line 220 may be switched from voltage 456 to voltage 458. This switching from voltage 454 to voltage 456 to voltage 458 therefore together may create second program pulse 420.

Voltage 456 may be steady for the duration called for by the second voltage duration instruction such that second voltage 422 results at a steady level. Voltage 456 may be switched to voltage 458 including falling time constant 457 according to the second falling time constant instruction such that second falling time constant 424 results.

In operation 310, memory cells programmed by the second program pulse 420 may be locked so as to not receive any further programming pulses. For example and not by way of limitation, twenty percent (20%) of memory cells in the memory page 212 may be successfully programmed by the second program pulse 420. Accordingly, these memory cells (i.e., the twenty percent (20%) that were programmed) may be locked so as to not receive any further programming pulses.

In operation 312, any number of additional program pulses (e.g., an nth program pulse 430) may be created in accordance with the nth program pulse tuning information. The nth voltage level, voltage duration, and voltage falling time constant instructions may cause the word line 220 and bit line 204 to create the nth program pulse 430.

For example and not by way of limitation, the nth voltage level instruction may be for an nth voltage 432, 433 of 8 volts, first steady, then followed by a linear decrease to 7 volts. The nth voltage duration instruction may be for an nth duration. The nth voltage falling time constant instruction may be for an nth voltage falling time constant 434. The word line 220 may be set to or remain at voltage 458 (e.g., 3 volts). The bit line 204 may be charged to or remain at a predetermined voltage (e.g., 8 volts). Voltage 458 of the word line (e.g., 3 volts) may be high enough that relative to the predetermined voltage of the bit line 204 (e.g., 8 volts), a net voltage (e.g., 5 volts) results that may be less than a voltage needed to program a memory cell.

The word line 220 may be switched from voltage 458 to voltage 460 steady, then linearly increased. During the steady phase, voltage 460 (e.g., 0 volts) may be low enough that relative to the predetermined voltage applied to the bit line 204 (e.g., 8 volts), a net voltage (e.g., 8 volts) results that is effective to program memory cells. During the linear increase phase, voltage 460 (0 increasing to 1 volt) may be low enough relative to the predetermined voltage applied to the bit line 204 (e.g., 8 volts), a net voltage (e.g., 8 decreasing to 7 volts) results that is effective to program memory cells. The word line 220 may be switched from voltage 460 to voltage 462. This switching from voltage 458 to voltage 460 to voltage 462 therefore together may create nth program pulse 430.

Voltage 460 may be steady and then linearly increased for the duration called for by the nth voltage duration instruction such that third voltage 432 results, first at a steady level, and then decreasing. Voltage 460 may be switched to voltage 462 including falling time constant 461 according to the nth falling time constant instruction such that nth falling time constant 434 results.

In alternative embodiments, program pulse tuning information may be read before each program pulse is created (e.g., second program pulse tuning information may be read after the first program pulse is created).

The foregoing description discloses only exemplary embodiments of the invention. Modifications of the above-disclosed embodiments of the present invention of which fall within the scope of the invention will be readily apparent to those of ordinary skill in the art. For instance, although in some embodiments, a specific device (e.g., memory array) may be discussed in carrying out the methods described herein, other devices (e.g., memory arrays) may be substituted.

Accordingly, while the present invention has been disclosed in connection with exemplary embodiments thereof, it should be understood that other embodiments may fall within the spirit and scope of the invention as defined by the following claims.

The invention claimed is:

1. A method of programming a plurality of two terminal memory cells comprising a first memory cell and a second memory cell, the method comprising:
    reading a plurality of sets of program pulse tuning instructions from a memory page, the memory page including the plurality of memory cells;
    creating a plurality of program pulses in accordance with the plurality of sets of program pulse tuning instructions to program the plurality of memory cells, wherein the plurality of sets of program pulse tuning instructions are different from one another in at least one respect;
    applying a first program pulse from the plurality of program pulses to the first memory cell and the second memory cell;
    locking the first memory cell from further programming pulses if the first memory cell is programmed by the first program pulse;
    applying a second program pulse from the plurality of program pulses to the second memory cell; and
    locking the second memory cell from further programming pulses if the second memory cell is programmed by the second program pulse.

2. The method of claim 1, wherein the reading operation comprises reading the plurality of program pulse tuning instructions from a sideband area of the memory page.

3. The method of claim 1, wherein each of the plurality of program pulse tuning instructions includes a voltage level instruction.

4. The method of claim 3, wherein at least one voltage level instruction includes a steady voltage.

5. The method of claim 3, wherein at least one voltage level instruction includes a varying voltage.

6. The method of claim 1, wherein each of the plurality of program pulse tuning instructions includes a voltage duration instruction.

7. The method of claim 1, wherein each of the plurality of program pulse tuning instructions includes a voltage rising time constant instruction or a voltage falling time constant instruction.

* * * * *